United States Patent
Watanabe

[11] Patent Number: 5,808,363
[45] Date of Patent: Sep. 15, 1998

[54] SEMICONDUCTOR DEVICE AND METHOD OF FABRICATING THE SAME

[75] Inventor: Takeshi Watanabe, Tokyo, Japan

[73] Assignee: NEC Corporation, Tokyo, Japan

[21] Appl. No.: 748,838

[22] Filed: Nov. 14, 1996

[30] Foreign Application Priority Data

Nov. 15, 1995 [JP] Japan ................................. 7-296551

[51] Int. Cl.$^6$ ................................................ H01L 23/48
[52] U.S. Cl. ........................................ 257/758; 257/773
[58] Field of Search ........................... 27/758–760, 750, 27/752, 773, 529, 665

[56] References Cited

U.S. PATENT DOCUMENTS

| | | | |
|---|---|---|---|
| 5,420,455 | 5/1995 | Gilmour et al. | 257/665 |
| 5,585,662 | 12/1996 | Ogawa | 257/529 |
| 5,616,960 | 4/1997 | Noda et al. | 257/759 |
| 5,652,459 | 7/1997 | Chen | 257/665 |

OTHER PUBLICATIONS

Howard, Edge Seal for Multilevel Integrated Circuit with Organic Interlevel Dielectric, IBM Technical Disclosure Bulletin, vol. 20, No. 8, pp. 3002–3003, Jan. 1978.

*Primary Examiner*—Sara W. Crane
*Attorney, Agent, or Firm*—Sughrue, Mion, Zinn, Macpeak & Seas, PLLC

[57] ABSTRACT

There is provided a semiconductor device including an upper wiring layer, a lower wiring layer, an interlayer insulating film sandwiched between the upper and lower wiring layers for electrically insulating the upper and lower wiring layers to each other, an insulating film formed on the interlayer insulating film, the insulating film being in planarized condition, and a wiring layer formed on a level with the insulating layer. The wiring layer horizontally surrounds a pit formed through the upper and lower wiring layers, the interlayer insulating film and the insulating film. Cut ends of the insulating film are exposed to a sidewall of the pit. Even if humidity is absorbed into the insulating film through the cut ends thereof exposed to the pit, humidity is not allowed to reach an internal circuit, because the insulating film is divided by the wiring layer. Thus, it is possible to prevent deterioration of performance and reliability of a semiconductor device which would be caused by humidity.

20 Claims, 7 Drawing Sheets

SEMICONDUCTOR DEVICE AND METHOD OF FABRICATING THE SAME

BACKGROUND OF THE INVENTION

1. Field of the Invention

The invention relates to a semiconductor device having a redundant circuit therein and also having a multi-layered wiring structure, and also to a method of fabricating such a semiconductor device.

2. Description of the Related Art

As a semiconductor device has been recently integrated in larger scale, a semiconductor device is designed to have a multi-layered wiring structure. In the multi-layered wiring structure, if a surface of the structure is formed to have irregularity because of a lower wiring layer, an upper wiring layer is likely to have defectiveness such as a step. Thus, many attempts have been made to relax the irregularity of a lower wiring layer. One of such attempts is explained hereinbelow with reference to FIGS. 1A to 1C.

As illustrated in FIG. 1A, there are formed a first insulating film 2 and then a second insulating film 4 both made of a silicon dioxide film all over a semiconductor substrate 1 by chemical vapor deposition (CVD). Then, there is formed a tungsten wiring layer 5 in a pattern on the second insulating film 4 by tungsten CVD. The tungsten wiring layer 5 has a thickness of about 500 nm. Then, plasma enhanced chemical vapor deposition (P-CVD) is carried out to thereby form a third insulating film 6 over the tungsten wiring layer 5 and the second insulating film 4. The third insulating film 6 is made of a plasma oxide film and has a thickness of about 500 nm. Then, an organic silica (SOG) film 7 is applied onto the third insulating film 6, followed by baking at about 400° C. for 30 minutes.

Then, as illustrated in FIG. 1B, the organic silica film 7 is etched back until the third insulating film 6 is exposed above the tungsten wiring layer 5. Thus, the organic silica film 7 remains unetched only between the patterned tungsten wiring layer 5, thereby irregularity between the wiring layer being reduced.

Then, as illustrated in FIG. 1C, there is formed a fourth insulating film 8 all over a resultant by P-CVD. The fourth insulating film 8 is made of a plasma oxide film and has a thickness of about 400 nm. Then, there is formed a contact hole 8a leading to the tungsten wiring layer 5. After the formation of the contact hole 8a, there is formed a wiring layer 9 in contact with the tungsten wiring layer 5 by sputtering. The wiring layer 9 is comprised of an AlSiCu layer having a thickness of 700 nm and a TiN layer having a thickness of 50 nm. Then, there is formed a cover film 10 having a thickness of about 1000 nm over the wiring layer 9.

As mentioned earlier, a semiconductor device may be provided with a redundant circuit in order to cope with device defectiveness which is likely to be caused by remarkable reduction in size of a device. In general, a redundant circuit is electrically connected to a main circuit through a fuse. When a defect occurs in a main circuit, a fuse is made to be broken to thereby replace a part of a main circuit with a redundant circuit.

For instance, in a semiconductor circuit illustrated in FIGS. 1A to 1C, there are formed fuses 3, which are made of tungsten silicide, on the first insulating film 2, as illustrated in FIG. 2A. Then, there is formed a pit 11 above the fuses 3 by selectively etching the cover film 10, the fourth and third insulating films 8 and 6, and the second insulating film 4, as illustrated in FIG. 2B, after the step as illustrated in FIG. 1C has been completed. As illustrated in FIG. 2B, the pit 11 terminates at a certain depth in the second insulating film 4 to thereby reduce a thickness of the second insulating film 4 above the fuses 3. When the fuses 3 are to be broken, a laser beam is irradiated to the fuses 3 through the pit 11. The fuses 3 are molten out by the laser beam.

As is obvious to those skilled in the art, the reason for the pit 11 is to increase the break-out efficiency of the fuses 3. As illustrated in FIG. 2B, by forming the pit 11, cut ends 7a of the organic silica film 7 are exposed to an inner sidewall of the pit 11. In such a condition, humidity derived from a plastic package in which a semiconductor device is encased with resin is absorbed into the organic silica film 7 through the cut ends 7a, and reaches an internal circuit through the organic silica film 7. Thus, an internal circuit is put in an electrically shortcircuited condition, resulting in insufficient performance and reduced reliability of a semiconductor device.

On the other hand, if the organic silica film 7 is etched so that all the organic silica film 7 is removed in an area in which the pit 11 is to be formed, it would take much time for etching thereby reducing fabrication efficiency. In addition, the organic silica film 7 has to have a reduced thickness even in an area in which wiring layers are to be formed, which would deteriorate the above mentioned planarization effect of a multi-layered wiring structure.

SUMMARY OF THE INVENTION

It is an object of the present invention to provide a semiconductor device and a method of fabricating the same both capable of preventing humidity from being absorbed into an internal circuit from a pit with the planarization effect by a multi-layered wiring structure being kept as it is.

In one aspect, there is provided a semiconductor device including an upper wiring layer, a lower wiring layer, an interlayer insulating film sandwiched between the upper and lower wiring layers for electrically insulating the upper and lower wiring layers from each other, and an insulating film formed on the interlayer insulating film, the insulating film being in planarized condition. The lower wiring layer is formed on a level with said insulating layer. A part of the lower wiring layer formes a wiring layer horizontally surrounding a pit formed through the upper wiring layer, the interlayer insulating film and the insulating film. Cut ends of the insulating film are exposed to a sidewall of the pit.

There is further provided a semiconductor device including an upper wiring layer, a lower wiring layer, an interlayer insulating film sandwiched between the upper and lower wiring layers for electrically insulating the upper and lower wiring layers to each other, and an insulating film formed on the interlayer insulating film, the insulating film being in planarized condition. The lower wiring layer is formed on a level with the insulating layer. A part of the lower wiring layer forms at least two wiring layers. An innermost one among the wiring layers horizontally surrounds a pit formed through the upper wiring layer, the interlayer insulating film and the insulating film. The other wiring layers are disposed so that a wiring layer surrounds an inner adjacent one and is surrounded by an outer adjacent one. Cut ends of the insulating film is exposed to a sidewall of the pit.

It is preferable that the wiring layers are made as dummy ones. There may be formed at least one fuse for a redundant circuit below the insulating film, in which case the pit is formed above the fuse. The fuse can be molten out by making use of the pit.

The insulating film may be made of any insulative material, but is preferably made of organic silica (SOG).

In another aspect, there is provided a method of fabricating a semiconductor device, including the steps of (a) forming a first insulating film on a semiconductor substrate, (b) forming a second insulating film on the first insulating film, (c) forming a wiring layer on the second insulating film, a part of the wiring layer forming a dummy wiring layer surrounding a region, (d) forming a third insulating film over a resultant, (e) applying an insulating film over the third insulating film, (f) etching back the insulating film to remove portions thereof located directly above the wiring layer, (g) forming a fourth insulating film all over a resultant, (h) forming a cover film over the fourth insulating film, and (i) forming a pit within the region, the pit starting from an upper surface of the cover film and having a depth so that cut ends of the insulating film are exposed to a sidewall of the pit.

There is further provided a method of fabricating a semiconductor device, including the steps of (a) forming a first insulating film on a semiconductor substrate, (b) forming a second insulating film on the first insulating film, (c) forming a wiring layer on the second insulating film, a part of the wiring layer forming at least two dummy wiring layers so that a dummy wiring layer surrounds an inner adjacent one and is surrounded by an outer adjacent one and that an innermost dummy wiring layer surrounds a region, (d) forming a third insulating film over a resultant, (e) applying an insulating film over the third insulating film, (f) etching back the insulating film to remove portions thereof located directly above the wiring layer, (g) forming a fourth insulating film all over a resultant, (h) forming a cover film over the fourth insulating film, and (i) forming a pit within the region, the pit starting from an upper surface of the cover film and having a depth so that cut ends of the insulating film are exposed to a sidewall of the pit.

It is preferable that the above mentioned method further includes the step of (j) forming at least one fuse for a redundant circuit on the first insulating film, the innermost dummy wiring layer surrounding at least a part of the fuse. The step (j) is to be carried out between the steps (a) and (b).

The pit preferably terminates at a certain depth in the second insulating film.

In accordance with the above mentioned invention, the insulating film such as an organic silica film is divided by the wiring layer. Thus, even if humidity is absorbed from cut ends of the insulating film which are exposed to a sidewall of the pit, humidity is interrupted by the insulating film to enter an internal circuit. Hence, it is possible to prevent deterioration of performance and reliability of a semiconductor device. In addition, since it is no longer necessary to completely etch the insulating film within a region in which the pit is formed, the planarization effect of a multi-layered wiring structure which would be brought by the insulating film can be enhanced.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1A:
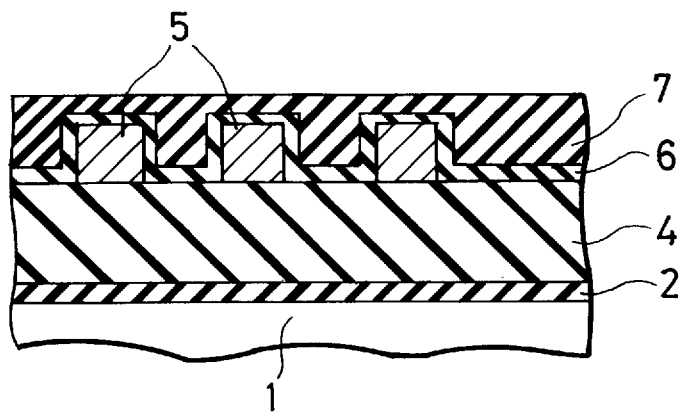
FIGS. 1A, 1B and 1C are cross-sectional views of a semiconductor device, each showing a step of a conventional method of fabricating a semiconductor device.
Figure 1B:
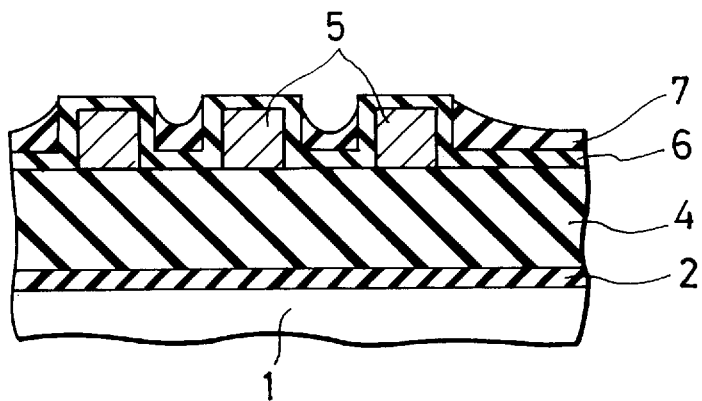
Figure 1C:
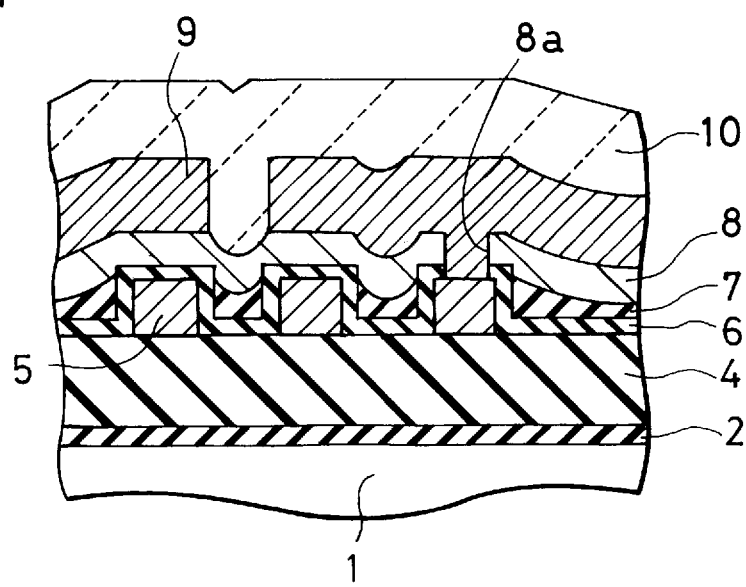
Figure 2A:
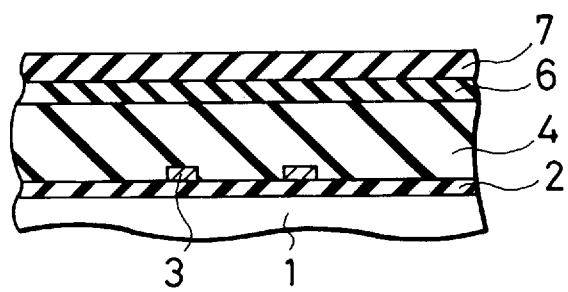
FIGS. 2A and 2B are cross-sectional views of the semiconductor device illustrated in FIGS. 1A to 1C, each illustrating a region in which a fuse is to be formed.
Figure 2B:
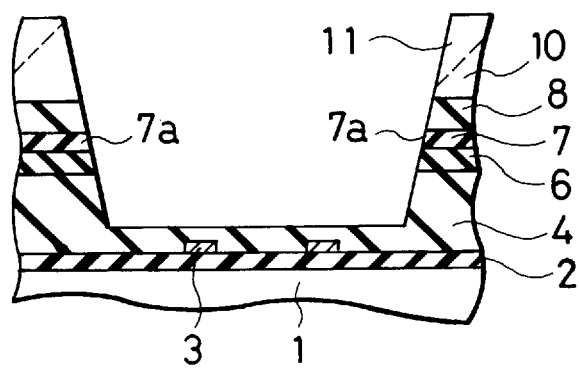
Figure 3A:
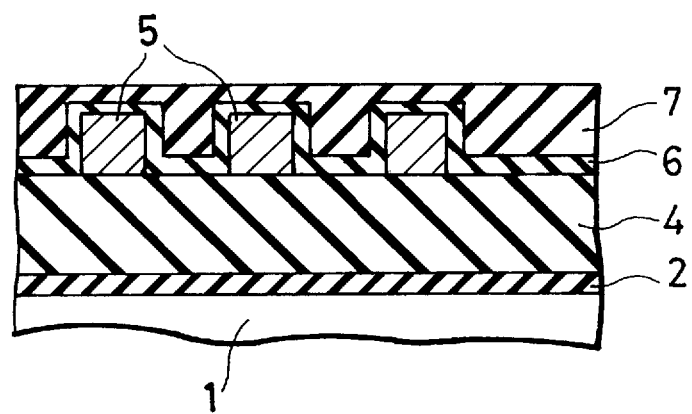
FIGS. 3A and 3B are cross-sectional views of a semiconductor device, each illustrating a first step of a method of fabricating a semiconductor device in accordance with the first embodiment of the present invention.
Figure 3B:
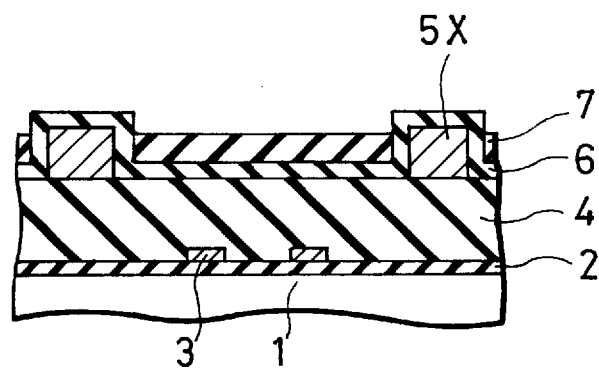
Figure 4A:
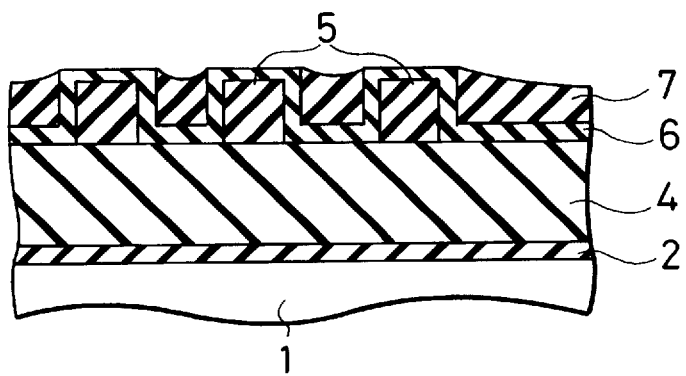
FIGS. 4A and 4B are cross-sectional views of a semiconductor device, each illustrating a second step of the inventive method.
Figure 4B:
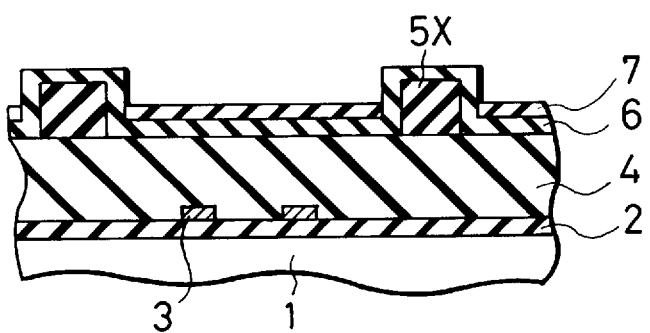
Figure 5A:
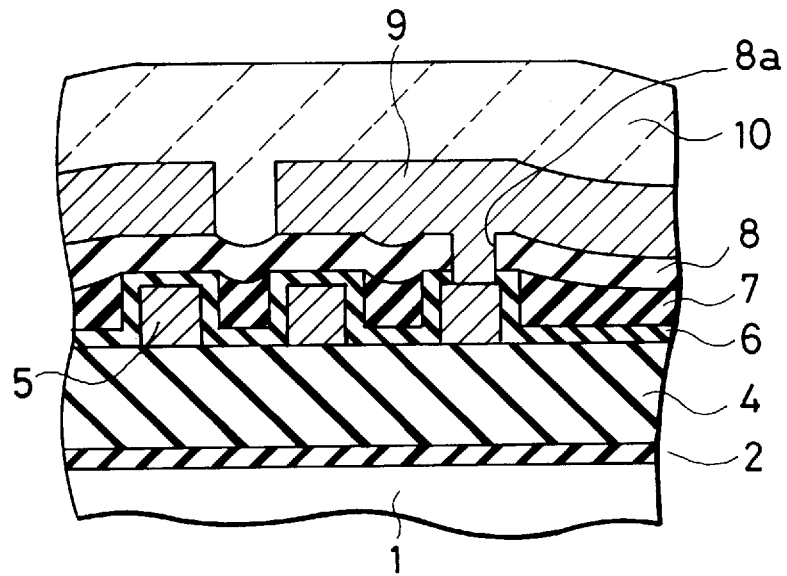
FIGS. 5A and 5B are cross-sectional views of a semiconductor device, each illustrating a third step of the inventive method.
Figure 5B:
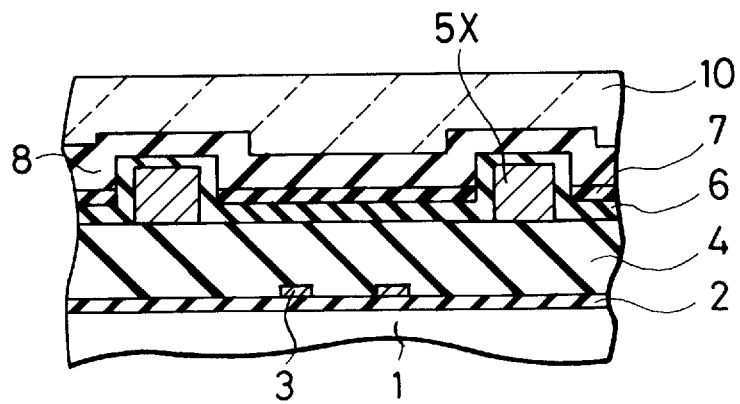

A first embodiment in accordance with the present invention will be explained hereinbelow with reference to FIGS. 3A to 6B, in which FIGS. 3A, 4A and 5A are cross-sectional views illustrating a region in which a wiring layer is formed (hereinafter, this region is referred to simply as "wiring layer region"), and FIGS. 3B, 4B and 5B are cross-sectional views illustrating a region in which a fuse is formed (hereinafter, this region is referred to simply as "fuse region").

First, there is formed a first insulating film 2 made of a silicon dioxide film all over a semiconductor substrate 1 by chemical vapor deposition (CVD). Then, as illustrated in FIG. 3B, fuses 3 are formed on the first insulating film 2 in the fuse region. The fuses 3 are made of tungsten silicide and have a thickness of about 150 nm. A second insulating film 4 is formed over the fuses 3 and the first insulating film 2. In the wiring layer region, there is formed a tungsten wiring layer 5 in a pattern on the second insulating film 4 by tungsten CVD. The tungsten wiring layer 5 has a thickness of about 500 nm. As illustrated in FIG. 3B, a part of the tungsten wiring layer 5 forms a dummy tungsten wiring layer 5X in the fuse region so that the dummy tungsten wiring layer 5X surrounds a region in which a pit is to be formed in a later mentioned step.

Then, plasma enhanced chemical vapor deposition (P-CVD) is carried out to thereby form a third insulating film 6 over both the tungsten wiring layer 5 and the second insulating film 4. The third insulating film 6 is made of a plasma oxide film and has a thickness of about 500 nm. Then, an organic silica (SOG) film 7 is applied onto the third insulating film 6, followed by baking at about 400° C. for 30 minutes.

Then, as illustrated in FIGS. 4A and 4B, the organic silica film 7 is etched back until the third insulating film 6 appears above the tungsten wiring layer 5. Thus, the organic silica film 7 remains unetched only between the patterned tungsten wiring layer 5 in the wiring layer region, thereby irregularity between the wiring layer 5 being reduced. In the fuse region, as illustrated in FIG. 4B, the organic silica film 7 remains unetched in a small thickness.

Then, as illustrated in FIGS. 5A and 5B, there is formed a fourth insulating film 8 all over a resultant by P-CVD. The fourth insulating film 8 is made of a plasma oxide film and has a thickness of about 400 nm. Then, there is formed a contact hole 8a leading to the tungsten wiring layer 5 in the wiring layer region. After the formation of the contact hole 8a, there is formed a wiring layer 9 in contact with the tungsten wiring layer 5 by sputtering. The wiring layer 9 is formed as a multi-layered structure including an AlSiCu layer having a thickness of 700 nm and a TiN layer having a thickness of 50 nm. Then, there is formed a cover film 10 having a thickness of about 1000 nm all over the wiring layer 9.

Figure 6A:
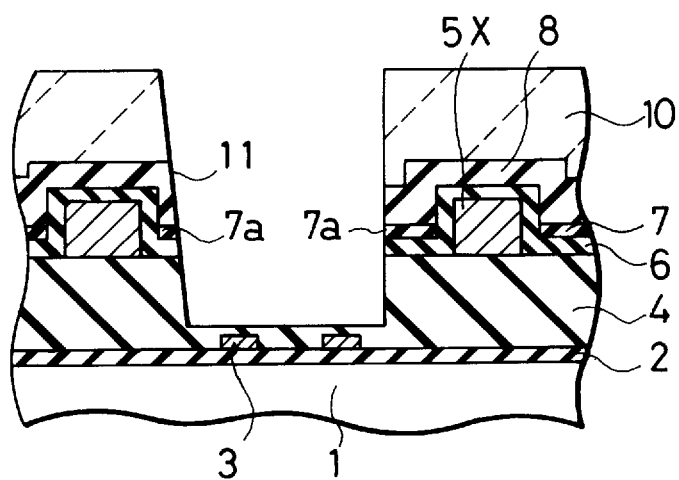
FIG. 6A is a cross-sectional view of a semiconductor device, illustrating a fourth step of the inventive method.

Then, as illustrated in FIG. 6A, there is formed a pit 11 in the fuse region above a part of the fuses 3 by selectively etching the cover film 10, the fourth and third insulating films 8 and 6, and the second insulating film 4. As illustrated, the pit 11 terminates at a certain depth of the second insulating film 4 to thereby reduce a thickness of the second insulating film 4 above the fuses 3. A thickness of the second insulating film 4 is reduced to about 300 to 400 nm above the fuses 3. When the fuses 3 are to be broken, a laser beam is irradiated to the fuses 3 through the pit 11. The fuses 3 are readily molten out by the laser beam.

Figure 6B:
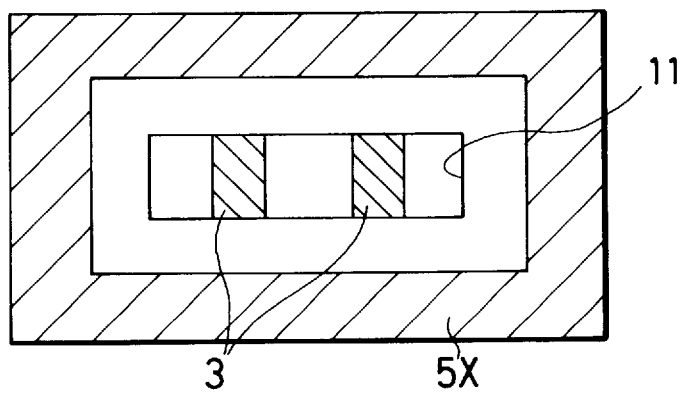
FIG. 6B is a plan view of a semiconductor device illustrated in FIG. 6A.

As illustrated in FIG. 6B, the pit 11 is formed within a region surrounded by the dummy tungsten wiring layer 5X. In the semiconductor device fabricated in accordance with the preferred embodiment, cut ends 7a of the insulating film 7 are exposed to an inner sidewall of the pit 11, as illustrated in FIG. 6A. Hence, after the semiconductor device is encased in a plastic package, humidity may enter the pit 11 and may be absorbed into an internal circuit (not illustrated) of the semiconductor device through the cut ends 7a of the insulating film 7. However, the pit 11 is surrounded by the dummy tungsten wiring layer 5X, which separates the cut ends 7a of the insulating film 7 from an internal circuit. Thus, humidity is interrupted from going through the dummy tungsten wiring layer 5X, and is not allowed to reach an internal circuit. Thus, it is possible to prevent shortcircuit in an internal circuit and deterioration in reliability of a semiconductor device.

In accordance with the above mentioned semiconductor device, even if the organic silica film 7 still remains existent in the fuse region, it is possible to prevent humidity from entering an internal circuit, as discussed above. Hence, it is no longer necessary to etch the organic silica film 7 deeply, which makes it possible to shorten etching time to thereby enhance a semiconductor device fabrication efficiency, and facilitate planarization in a multi-layered wiring structure.

The inventor conducted an experiment in order to prove the above mentioned advantage provided by the present invention. In the experiment, a plurality of semiconductor devices fabricated in accordance with the present invention were encased in a plastic package, and were left in the following condition for 500 hours:

Temperature; 130° C.

Pressure; 25 atm

Humidity; 100%

The result of the experiment was that there could not be found a defect in any of the semiconductor devices.

Figure 7:
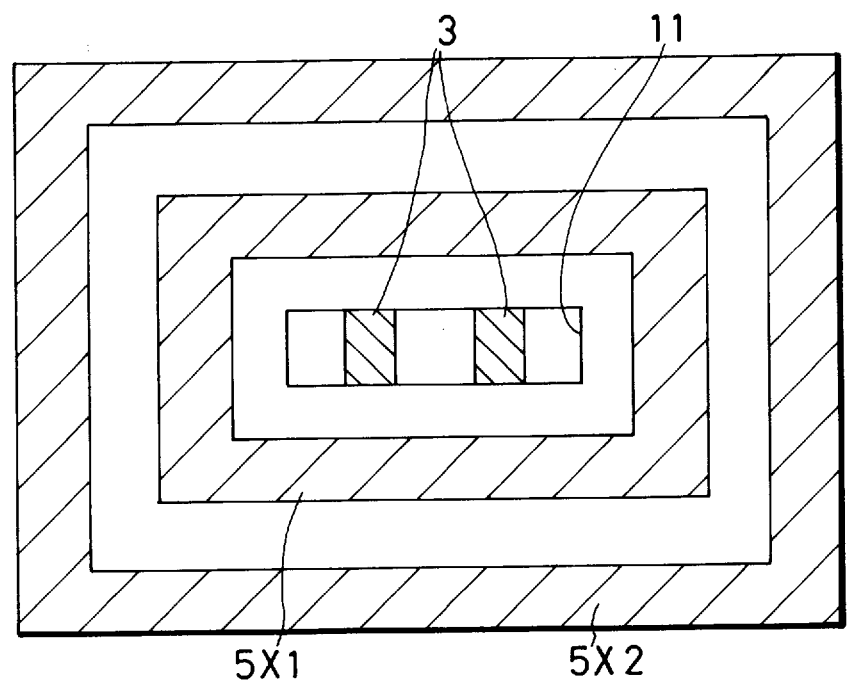
FIG. 7 is a view of a semiconductor device to be fabricated in accordance with the second embodiment of the present invention.

FIG. 7 illustrates a semiconductor device made in accordance with the second embodiment of the present invention. The second embodiment is different from the first embodiment only in that there are formed two dummy tungsten wiring layers 5X1 and 5X2 in the fuse region. As illustrated, the inner dummy wiring layer 5X1 surrounds the Pit 11, and is surrounded by the outer dummy wiring layer 5X2. The second embodiment provides the same advantage as that of the first embodiment.

The number of the dummy tungsten wiring layers is not to be limited to two, but may be three or greater, if there is sufficient space to do so in the fuse region. When a plurality of the dummy tungsten wiring layers are formed, they are disposed so that an innermost one horizontally surrounds the pit, and that the other surrounds an inner adjacent one and is surrounded by an outer adjacent one. The greater number of the dummy wiring layers can ensure even greater prevention of entrance of humidity into an internal circuit through the organic silica film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

What is claimed is:

1. A semiconductor device comprising:

an upper wiring layer;

a lower wiring layer;

a first insulating film sandwiched between said upper and lower wiring layers for electrically insulating said upper and lower wiring layers from each other; and a second insulating film formed on said first insulating film, said second insulating film being in planarized condition;

said lower wiring layer being formed substantially coplanar with said second insulating film, a part of said lower wiring layer constituting a wiring layer surrounding a horizontal cross section of a pit formed through said upper wiring layer, said first insulating film and said second insulating film, ends of said second insulating film being exposed to a sidewall of said pit.

2. The semiconductor device as set forth in claim 1, wherein said wiring lower layer is a dummy one.

3. The semiconductor device as set forth in claim 1, wherein there is formed at least one fuse for a redundant circuit below said second insulating film, said pit being formed above said fuse.

4. The semiconductor device as set forth in claim 1, wherein said second insulating film is made of organic silica.

5. A semiconductor device comprising:

an upper wiring layer;

a lower wiring layer;

a first insulating film sandwiched between said upper and lower wiring layers for electrically insulating said upper and lower wiring layers from each other; and a second insulating film formed on said first insulating film, said second insulating film being in planarized condition;

said lower wiring layer being formed coplanar with said second insulating layer, a part of said lower wiring layer constituting at least two layer portions, an innermost portion among said lower wiring layer portions surrounding a horizontal cross section of a pit formed through said upper wiring layer, said first insulating film and said second insulating film, ends of said second insulating film being exposed to a sidewall of said pit, the other lower wiring layer portions being disposed concentric to one another and said innermost portion.

6. The semiconductor device as set forth in claim 5, wherein said lower wiring layer portions are dummy ones.

7. The semiconductor device as set forth in claim 5, wherein there is formed at least one fuse for a redundant circuit below said second insulating film, said pit being formed above said fuse.

8. The semiconductor device as set forth in claim 5, wherein said second insulating film is made of organic silica.

9. A semiconductor device comprising:

a first insulating film layer;

a lower wiring pattern layer formed over a portion of said first insulating film layer;

a second insulating film layer formed over said lower wiring pattern layer and said first insulating film layer;

a third insulating film layer formed over said second insulating film layer, wherein said third insulating film layer is planarized so that it does not extend above a top of a portion of said second insulating film layer which is above said lower wiring pattern layer, such that said third insulating film layer is substantially coplanar with said lower wiring pattern layer;

an upper wiring pattern layer formed over a portion of said third insulating film layer;

a pit formed through said upper wiring layer, said third insulating film layer, and said second insulating film layer, wherein said pit has a periphery defined by at least one side wall such that ends of said third insulating film layer are exposed to said at least one side wall of said pit; and a portion of said lower wiring pattern layer surrounding the periphery of said pit.

10. The semiconductor device as set forth in claim 9, further comprising a fourth insulating film layer formed between said third insulating film layer and said upper wiring pattern layer.

11. The semiconductor device as set forth in claim 10, wherein a portion of said upper wiring pattern layer extends through said fourth insulating film layer to electrically contact a portion of said lower wiring pattern layer.

12. The semiconductor device as set forth in claim 11, wherein the portion of said lower wiring pattern layer which surrounds the periphery of said pit is not in electrical contact with said upper wiring pattern layer.

13. The semiconductor device as set forth in claim 9, wherein the thickness of the second insulating layer is not as great as the thickness of the lower wiring pattern layer.

14. The semiconductor device as set forth in claim 9, further comprising a cover film layer disposed over said upper wiring pattern layer.

15. The semiconductor device as set forth in claim 14, further comprising a fifth insulating layer disposed beneath said first insulating layer.

16. The semiconductor device as set forth in claim 14, further comprising a substrate layer beneath said first insulating layer.

17. The semiconductor device as set forth in claim 9, further comprising a pit bottom formed within said first insulating layer such that said pit extends only partially through said first insulating layer.

18. The semiconductor device as set forth in claim 17, further comprising a fuse disposed within said first insulating layer.

19. The semiconductor device as set forth in claim 18, wherein at least a portion of said fuse is located beneath said pit bottom.

20. The semiconductor device as set forth in claim 17, wherein said portion of said lower wiring pattern layer surrounding said pit further comprises a plurality of concentric subportions.

* * * * *